(12) United States Patent
Diard

(10) Patent No.: US 9,384,583 B2
(45) Date of Patent: Jul. 5, 2016

(54) NETWORK DISTRIBUTED PHYSICS COMPUTATIONS

(75) Inventor: Franck Diard, Mountain view, CA (US)

(73) Assignee: NVIDIA Corporation, Santa Clara, CA (US)

(*) Notice: Subject to any disclaimer, the term of this patent is extended or adjusted under 35 U.S.C. 154(b) by 2167 days.

(21) Appl. No.: 11/553,677

(22) Filed: Oct. 27, 2006

(65) Prior Publication Data

US 2008/0100626 A1 May 1, 2008

(51) Int. Cl.
*G06T 13/00* (2011.01)
*G06T 15/00* (2011.01)
*G06F 17/50* (2006.01)

(52) U.S. Cl.
CPC ............... *G06T 15/005* (2013.01); *G06T 13/00* (2013.01); *G06F 17/5009* (2013.01)

(58) Field of Classification Search
CPC ... G06T 15/005; G06T 13/00; G06F 17/5009; G06F 3/04815; G06F 3/1438; G09G 2352/00; G09G 5/397; A63F 13/10; A63F 13/12
USPC ................................................ 345/502–503
See application file for complete search history.

(56) References Cited

U.S. PATENT DOCUMENTS

| | | | |
|---|---|---|---|
| 7,119,808 B2* | 10/2006 | Gonzalez et al. | 345/502 |
| 2005/0272492 A1* | 12/2005 | Stelly, III | 463/1 |
| 2007/0094325 A1* | 4/2007 | Ih et al. | 709/203 |
| 2008/0055321 A1* | 3/2008 | Koduri | 345/505 |

* cited by examiner

*Primary Examiner* — Hau Nguyen
(74) *Attorney, Agent, or Firm* — Artegis Law Group, LLP

(57) ABSTRACT

An application executing on a rendering computer invokes a physics function request, e.g., to model the movement and interaction of objects to be rendered. The physics function request specifies a physics function to be performed on input data. Physics function request data is formatted for transmission over a network. The physics computer receives the physics function request data and performs an associated physics function using a physics GPU to generate physics computation result data. The physics computation result data is transmitted to the rendering computer over the network. A rendering GPU renders an image using the physics computation result data.

20 Claims, 6 Drawing Sheets

NETWORK DISTRIBUTED PHYSICS COMPUTATIONS

BACKGROUND OF THE INVENTION

The present invention relates in general to graphics processors, for example as may be found in a personal computer, and in particular to systems and methods for executing an application that includes physics computations using multiple networked computers.

Graphics processing is an important feature of modern high-performance computing systems. Mathematical procedures are implemented to render (draw) graphic primitives such as triangles on a display to produce desired visual images. Real time animation is based on the high-speed processing of graphic primitives to produce visually accurate moving images, e.g., in video games or the like.

Graphics processing is typically performed using an application program interface (API) that provides a standardized software interface that can be run on multiple platforms, operating systems, and hardware. Examples of graphics APIs include the Open Graphics Library (OpenGL), Direct 3D (D3D), and the forthcoming DirectX10. In general, graphics APIs include a predetermined, standardized set of function calls that are interpreted by a graphics driver program and executed by a graphics processing unit (GPU) associated with the driver. For example, in a computer system that supports OpenGL, the operating system and application software programs invoke rendering functions by making calls according to OpenGL without regard for how those functions are implemented in the GPU hardware.

A general-purpose GPU (GPGPU) is a GPU that can be used to perform general-purpose computations in addition to or instead of the usual rendering operations. A GPGPU can be created by defining a library of computational function calls (e.g., for modeling of objects' behavior according to the laws of physics) and developing a driver program capable of responding to the function calls by issuing appropriate commands to the GPU. For example, a GPGPU can be used to execute a physics pass and a rendering pass to generate an image. In the physics pass, the GPGPU driver receives function calls related to physics computations from an application. The physics computations may be used to model the movement and interaction of objects to be rendered (e.g., falling bodies, collisions, rigid body physics, etc.). The GPGPU driver operates the GPU to apply the specified physics computations to the input and manages the output, e.g., by delivering output data representing the various objects as input to a rendering pipeline of the GPGPU. In the rendering pass, the output data from the physics computations is used to render an image to a frame buffer for display. The workflow repeats for each subsequent frame. The physics pass and the rendering pass are executed sequentially on the same GPGPU.

Using a GPGPU for physics computations has the advantage that the high degree of parallel processing available in a GPGPU allows physics computations to be performed in parallel on many objects. The resulting physics throughput of a GPGPU is thus higher than the corresponding throughput of a CPU. However, for real-time animation (which requires new frames at a rate of ~30 Hz to achieve realistic smoothness), the additional burden of physics computation in the GPGPU reduces the time available for rendering operations. It would therefore be desirable to provide systems with high throughput for physics computations in which the physics computations do not compete with rendering operations for GPU resources.

BRIEF SUMMARY OF THE INVENTION

Accordingly, embodiments of the present invention include a system and a method for executing an application that includes physics computations using networked computers. A physics computer and a rendering computer are linked via a network connection. An application executing on the rendering computer invokes a physics function request, e.g., to model the movement and interaction of objects to be rendered. The physics function request specifies a physics function to be performed on input data. Physics function request data is formatted for transmission over a network. The physics computer receives the physics function request data and performs an associated physics function using a general-purpose GPU (referred to herein as a "physics GPU") to generate physics computation result data. The physics computation result data is transmitted to the rendering computer over the network. A GPU on the rendering computer (referred to herein as a "rendering GPU") renders an image using the physics computation result data.

In one embodiment, the physics function may be performed by more than one physics GPUs operating in parallel on the same physics computer or on different physics computers. In another embodiment, applications executing on multiple rendering computers may generate additional physics function requests to be processed by one or more physics computers. A physics function requested by a rendering computer may be assigned to an idle physics GPU of a physics computer or to a physics GPU with a relatively low processing load. Performing physics functions concurrently with rendering on one or more separate physics GPUs in computers separate from the rendering computer can speed up the physics computation process by reducing or eliminating the competition for system resources between physics computations and rendering computations. The distribution of the physics computations across multiple physics servers on a network reduces the bandwidth at any one server and allows for a more flexible configuration of physics servers and rendering clients.

DETAILED DESCRIPTION OF THE INVENTION

System Architecture

Figure 1:
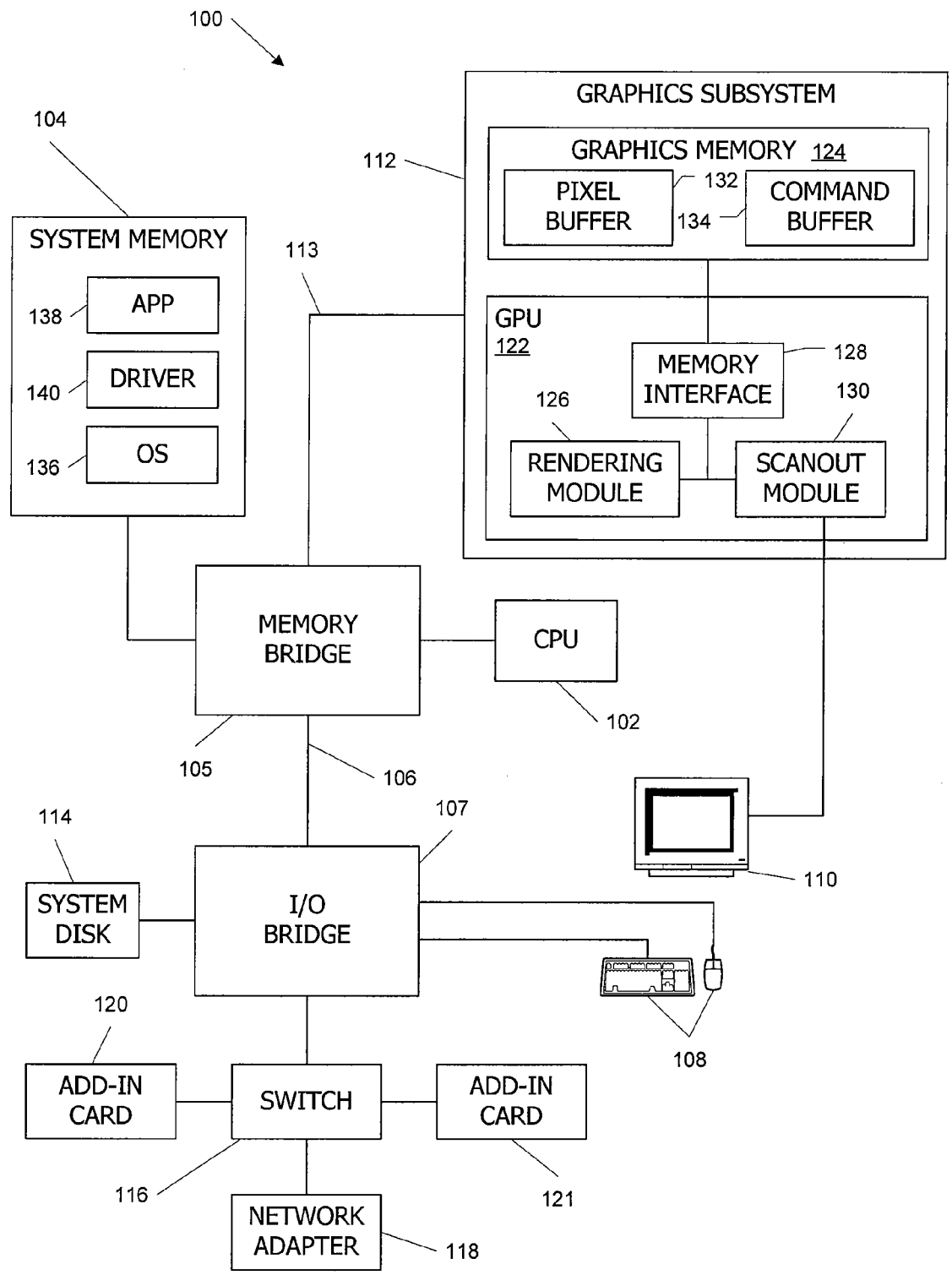
FIG. 1 is a block diagram of a computer system according to an embodiment of the present invention.

FIG. 1 is a block diagram of a computer system 100 according to an embodiment of the present invention. Computer system 100 includes a central processing unit (CPU) 102 and a system memory 104 communicating via a bus path that includes a memory bridge 105. Memory bridge 105, which may be, e.g., a Northbridge chip, is connected via a bus or other communication path 106 (e.g., a HyperTransport link) to an input/output (I/O) bridge 107. I/O bridge 107, which may be, e.g., a Southbridge chip, receives user input from one or more user input devices 108 (e.g., keyboard, mouse) and forwards the input to CPU 102. Visual output is provided on a pixel based display device 110 (e.g., a CRT or LCD based monitor) operating under control of a graphics processing subsystem 112 coupled to memory bridge 104 via a bus or other communication path 113, e.g., a PCI Express (PCI-E) or Accelerated Graphics Port (AGP) link. A system disk 114 is also connected to I/O bridge 107. A switch 116 provides connections between I/O bridge 107 and other peripheral components such as a network adapter 118 and various add-in cards 120, 121. Other components (not explicitly shown), including removable-storage drives (e.g., floppy disk, compact disk (CD), and/or DVD drives) may also be connected to I/O bridge 107. In some embodiments, some or all of the connections among various components of system 100 are implemented using PCI-E. In other embodiments, some or all of the connections may be implemented using other bus or point-to-point communication protocols, such as PCI (Peripheral Component Interconnect), AGP (Accelerated Graphics Port), HyperTransport, or any other suitable protocol(s).

Graphics processing subsystem 112 includes a graphics processing unit (GPU) 122 and a graphics memory 124, which may be implemented, e.g., using one or more integrated circuit devices such as programmable processors, application specific integrated circuits (ASICs), and memory devices. GPU 122 includes a rendering module 126, a memory interface module 128, and a scanout module 130. Rendering module 126 may be configured to perform various tasks related to generating pixel data from graphics data supplied via bus 113 (e.g., implementing various 2-D and or 3-D rendering algorithms), interacting with memory interface 128 to store and update pixel data, and the like. Rendering module 126 is advantageously configured to generate pixel data from 2-D or 3-D scene data provided by various programs executing on CPU 102. The particular configuration of rendering module 126 may be varied as desired, and a detailed description is omitted as not being critical to understanding the present invention.

Memory interface module 128, which communicates with rendering module 126 and scanout module 130, manages interactions with graphics memory 124. Memory interface module 128 may also include pathways for writing pixel data received via bus 113 to graphics memory 124 without processing by rendering module 128.

Scanout module 130 reads pixel color data from graphics memory 124 and transfers the data to display device 110 to be displayed. In one embodiment, scanout module 130 operates isochronously, scanning out frames of pixel data at a prescribed refresh rate (e.g., 80 Hz) regardless of any other activity that may be occurring in GPU 122 or elsewhere in system 100. The particular configuration of scanout module 130 may be varied as desired, and a detailed description is omitted as not being critical to understanding the present invention.

CPU/GPU Communication

During operation of system 100, CPU 102 executes various programs that are (temporarily) resident in system memory 104. In one embodiment, these programs include one or more operating system (OS) programs 136, one or more application programs 138, and one or more driver programs 140 for controlling operation of GPU 122. Although these programs are shown as residing in system memory 104, the invention is not limited to any particular mechanism for supplying program instructions for execution. For instance, at any given time some or all of the program instructions for any of these programs may be present within CPU 102 (e.g., in an on-chip instruction cache and/or various buffers and registers), in a page file or memory mapped file on system disk 114, and/or in other storage space.

Operating system programs 136 and/or application programs 138 may be of conventional design. An application program 138 may be, for instance, a video game program that generates graphics data and invokes appropriate functions of rendering module 126 in GPU 122 to transform the graphics data to pixel data. The same application program 138 may also invoke physics functions using a physics library. Another application program 138 may generate pixel data and provide the pixel data to graphics memory 124 for display by GPU 122. It is to be understood that any number of application programs that generate pixel and/or graphics data may be executing concurrently on CPU 102. Operating system programs 136 (e.g., the Graphical Device Interface (GDI) component of the Microsoft Windows operating system) may also generate pixel and/or graphics data to be processed by GPU 122.

Driver program 140 enables communication with GPU 122, including both rendering module 126 and scanout module 130. Driver program 140 implements one or more standard graphics APIs, such as Open GL, DirectX, or D3D for communication with GPU 122, as well as a physics API as described below. Any number or combination of APIs may be supported, and in some embodiments separate driver programs 140 are provided to implement different APIs. By invoking appropriate API function calls, operating system programs 136 and/or application programs 138 instruct driver program 140 to transfer geometry data or pixel data to graphics processing subsystem 112, to control operations of rendering module 126, to modify state parameters for scanout module 130, and so on. API function calls may invoke physics computations or other general-purpose computations by accessing a physics library that is configured to use remote physics resources. The specific commands and/or data transmitted to graphics processing subsystem 112 by driver program 140 in response to an API function call may vary depending on the implementation of GPU 122, and driver program 140 may also transmit commands and/or data implementing additional functionality (e.g., special visual effects) not controlled by operating system programs 136 or application programs 138.

It will be appreciated that the system described herein is illustrative and that variations and modifications are possible. The bus topology, including the number and arrangement of bridges, may be modified as desired. For instance, in some embodiments, system memory 104 is connected to CPU 102 directly rather than through a bridge, and other devices communicate with system memory 104 via memory bridge 105 and CPU 102. In other alternative topologies, graphics processing subsystem 112 is connected to I/O bridge 107 rather than to memory bridge 105. In still other embodiments, I/O bridge 107 and memory bridge 105 might be integrated into a single chip. The particular components shown herein are optional; for instance, any number of add-in cards or peripheral devices might be supported. In some embodiments, switch 116 is eliminated, and network adapter 118 and add-in cards 120, 121 connect directly to I/O bridge 107.

The connection of GPU 122 to the rest of system 100 may also be varied. In some embodiments, graphics system 112 is implemented as an add-in card that can be inserted into an expansion slot of system 100. In other embodiments, a GPU is integrated on a single chip with a bus bridge, such as memory bridge 105 or I/O bridge 107.

GPU 122 may be provided with any amount of local graphics memory, including no local memory, and may use local memory and system memory in any combination. For instance, in a unified memory architecture (UMA) embodiment, no dedicated graphics memory device is provided, and the GPU uses system memory exclusively or almost exclusively. In UMA embodiments, the GPU may be integrated into a bus bridge chip or provided as a discrete chip with a high-speed bus (e.g., PCI-E) connecting the GPU to the bridge chip and system memory.

It is also to be understood that any number of GPUs may be included in a system, e.g., by including multiple GPUs on a single graphics card or by connecting multiple graphics cards to bus 113. Multiple GPUs may be operated in parallel to generate images for the same display device or for different display devices.

In addition, GPUs embodying the present invention may be incorporated into a variety of devices, including general purpose computer systems, video game consoles and other special purpose computer systems, DVD players, handheld devices such as mobile phones or personal digital assistants, and so on.

Network Distributed Physics Computations

Figure 2:
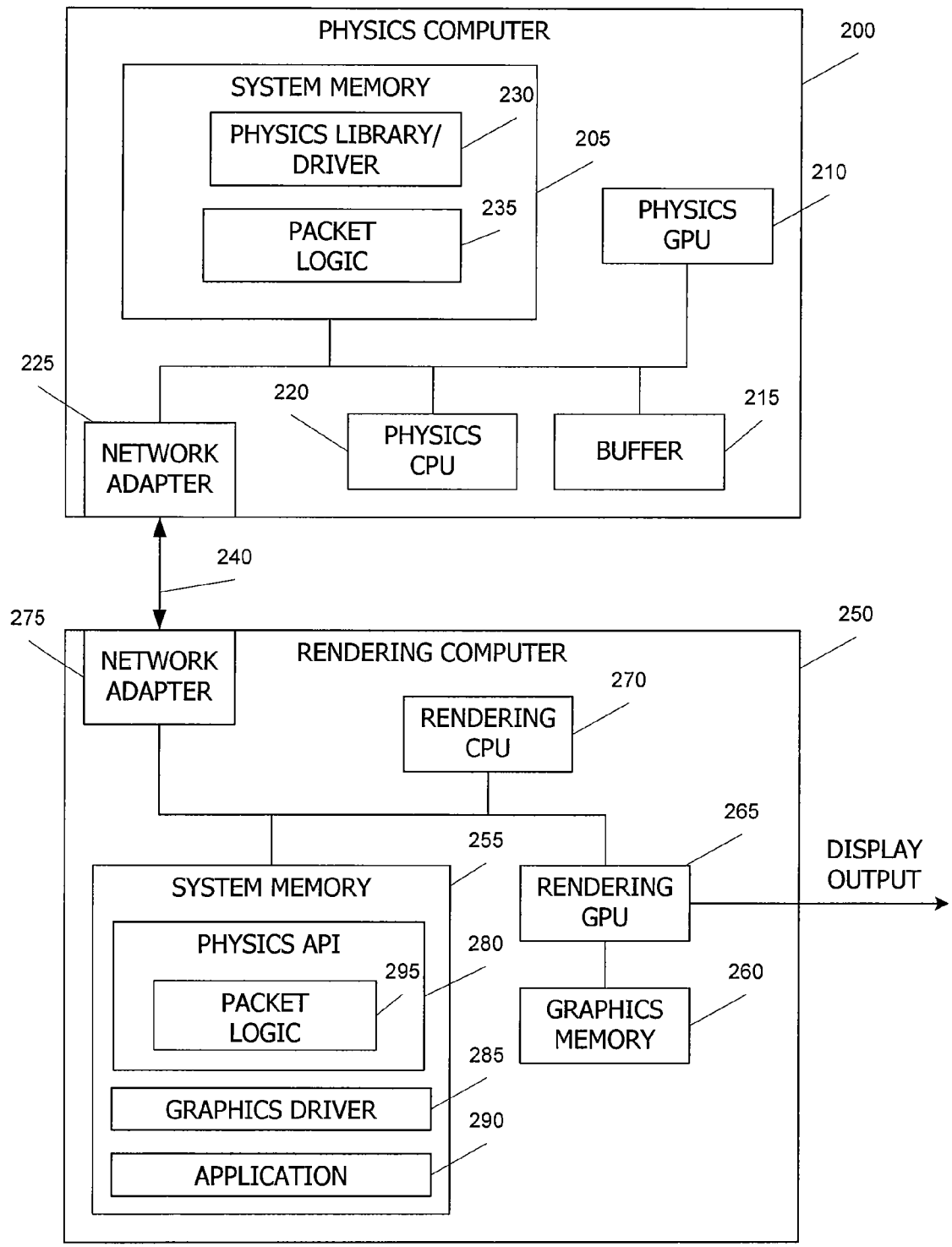
FIG. 2 is a block diagram of a system for executing an application that includes physics computations using two networked computers, according to an embodiment of the present invention.

FIG. 2 is a block diagram of a system for executing an application that includes physics computations using two networked computers, according to an embodiment of the present invention. The system includes two computers—physics computer 200 and rendering computer 250—communicably coupled by a network connection 240. Physics computer 200 and rendering computer 250 may each be an instance of computer system 100 of FIG. 1, or a variation thereof. The "rendering" and "physics" designations are used herein as a convenience to distinguish the two computer systems and their respective components; it is to be understood that the two systems can be of identical design, and that the same system could be used at one time as a physics computer and at another time as a rendering computer.

Physics computer 200 includes system memory 205, physics GPU 210, buffer 215, physics CPU 220, and network adapter 225. System memory 205 stores various programs and data, including physics library/driver 230 and packet logic 235. Rendering computer 250 includes system memory 255, graphics memory 260, rendering GPU 265, rendering CPU 270 and network adapter 275. System memory 255 stores various programs and data, including physics API 280, graphics driver 285, and application 290. Physics API 280 includes packet logic 295. Other components of computer system 100 not relevant to this description are not shown in the diagram but could be present in physics computer 200 or rendering computer 250.

Physics CPU 220 and rendering CPU 270 may be the same type of CPU or may be of different types. Physics GPU 210 and rendering GPU 265 may also be the same or of different types. Physics GPU 210 is always a general-purpose GPU, but rendering GPU 265 does not need to be a general-purpose GPU. For example, rendering GPU 265 may be configured to recognize only rendering commands.

Physics computer 200 and rendering computer 250 are linked via network connection 240 between network adapters 225, 275. The computers may be indirectly connected such as through a local area network (LAN), wide area network (WAN) or Internet network, or the computers may be directly connected such as through a FireWire (IEEE 1394) interface. The computers may be configured to operate as a client/server system. In one embodiment, physics computer 200 is a server that does not necessarily include user input/output devices (e.g., a blade server or the like).

The programs used by physics computer 200 and rendering computer 250 are stored in respective system memories 205, 255. In rendering computer 250, rendering CPU 270 executes an application 290 that requires physics computations and rendering operations based on the results of the physics computations (e.g., a video game program). Application 290 may be conventional and may include physics function calls in accordance with a conventional physics API and rendering function calls in accordance with a conventional graphics API. Graphics driver 285 responds to graphics API calls by sending suitable commands and/or data associated with the physics function request to rendering GPU 265. A particular implementation of graphics driver 285 is not critical to the present invention; conventional graphics drivers may be used.

Application 290 calls physics API 280 to invoke a physics function request (i.e., a request to perform a physics function on input data). For instance, application 290 may invoke a physics function request to determine the motion and/or interactions of objects being rendered. Physics API 280 is configured to use a remote physics node (e.g., physics GPU 210) and responds to the physics API call by formatting the physics function request and the associated input data (e.g., vertices and/or primitives representing the objects) for transmission over network connection 240. For example, physics API 280 may use packet logic 295 to assemble the physics function request and the associated input data into data packets. Physics API 280 then sends the physics function request and associated input data to physics computer 200 over network connection 240 using network adapters 275, 225. In one embodiment, all physics function requests are forwarded to physics computer 200 for processing. In another embodiment, some physics function requests are handled locally at rendering computer 250, and physics API 280 may include a corresponding portion of the physics library.

Physics computer 200 receives the physics function data from rendering computer 250. Physics CPU 220 reads the physics function data request and associated input (e.g., using packet logic 235 to extract information from the packets) and invokes corresponding physics function commands in physics library/driver 230. Physics library/driver 230 forwards the corresponding physics function commands to physics GPU 210. Physics GPU 210 performs the physics function by executing the commands using the input data and writes the physics computation results to a local buffer 215, which may be, e.g., in system memory 205 or other memory accessible to physics GPU 210 and physics CPU 220. The physics computation results may be, e.g., updated versions of the input vertices and/or primitives, with the updates being computed from the physics commands and the input vertices and/or primitives in a generally conventional manner. Physics CPU 220 assembles the physics computation results in a protocol suitable for network transmission (e.g., one or more packets) and sends the results to rendering computer 250 over network connection 240.

Rendering computer 250 receives the physics computation results from physics computer 200. Rendering CPU 270 stores the physics computation results in graphics memory 260. In response to graphics API calls from application 290, graphics driver 285 makes graphics calls to rendering GPU 265 to perform rendering operations on the physics computation results. Thus, the results of the physics computations performed by physics GPU 210 become inputs for the rendering operations of rendering GPU 265. Rendering CPU 270 advantageously waits for the physics computation results to be returned from physics GPU 210 before issuing graphics calls to rendering GPU 265.

It should be noted that the operation of physics API 280 is advantageously transparent to application program 290. That is, application program 290 may invoke physics function calls in exactly the same manner as it would if the calls were being received by a conventional physics driver; physics API 280 can divert the calls to physics computer 200 for processing by physics GPU 210 under control of physics library/driver 230.

Figure 3:
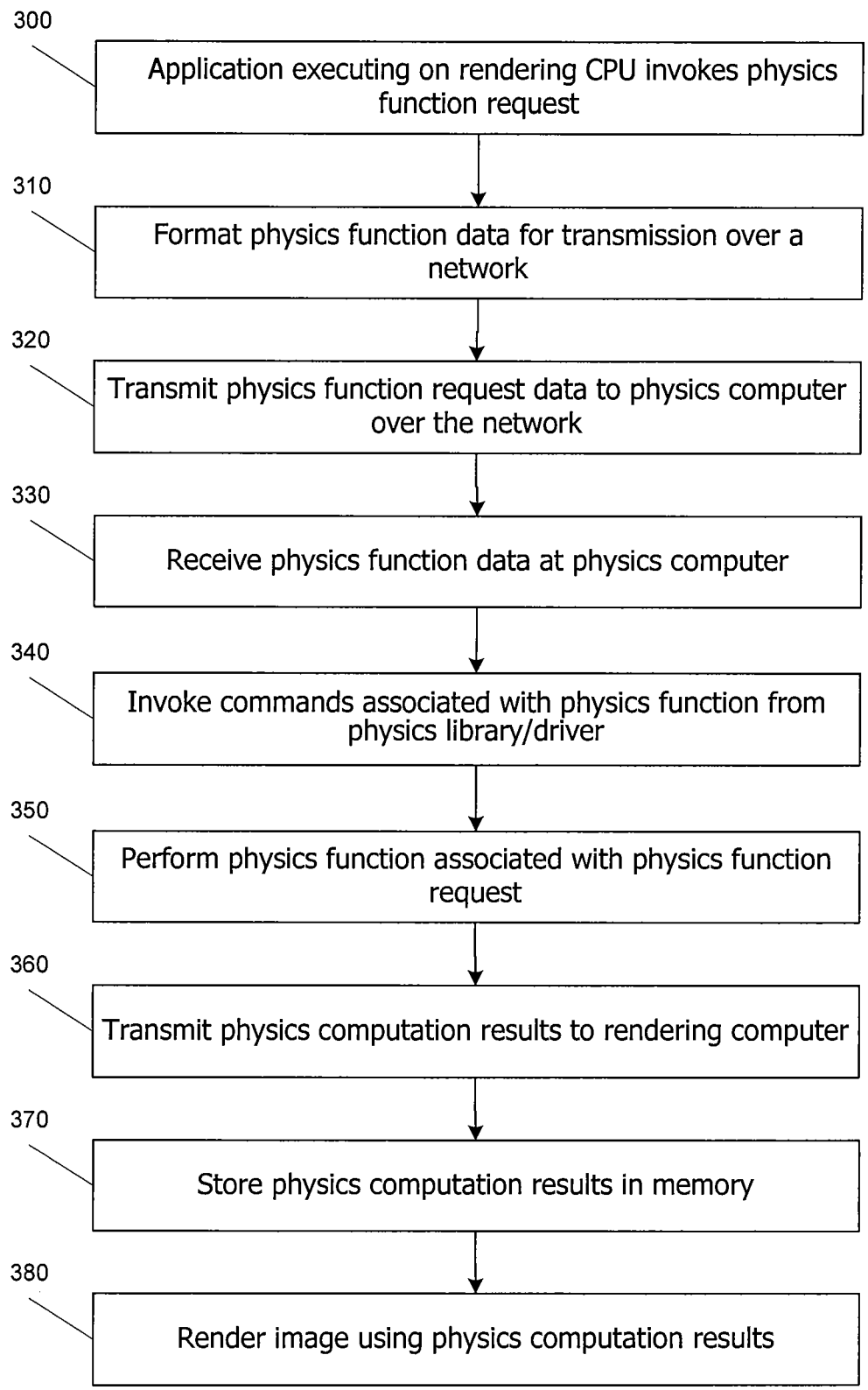
FIG. 3 is a flowchart illustrating a method of executing an application that includes physics computations using two networked computers, according to an embodiment of the present invention.

FIG. 3 is a flowchart illustrating a method of executing an application that includes physics computations using two networked computers, according to an embodiment of the present invention. Application 290 (e.g., a video game program) executes on rendering CPU 270 of rendering computer 250. At operation 300, application 290 invokes a physics function request to model the movement and interaction of objects to be rendered (e.g., falling objects, colliding objects, etc.).

In response to the physics function request, the physics function request and associated input data (collectively referred to as "physics function data") are formatted for transmission over a network at operation 310. In one embodiment, rendering computer 250 uses packet logic 295 to assemble the physics function data into one or more data packets for network transmission. The packet format advantageously conforms to the network protocol for network connection 240; conventional protocols such as TCP/IP may be used.

The physics function data are transmitted to physics computer 200 over the network at operation 320. Physics computer 200 receives the physics function data at operation 330. Physics CPU 220 identifies a physics function associated with the physics function request and invokes commands from physics library/driver 230 that are associated with the identified physics function at operation 340. In response to the invoked commands, physics GPU 210 performs the identified physics function using the input data at operation 350 and generates physics computation results. The results are stored, e.g., in buffer 215.

Physics computer 200 transmits the physics computation results to rendering computer 250 over network connection 240 at operation 360. Rendering computer 250 stores the physics computation results received from physics computer 200 in memory accessible to rendering GPU 265 at operation 370. The memory may be, e.g., system memory 255 or graphics memory 260. An image is rendered by rendering GPU 265 using the physics computation results at operation 380.

While rendering GPU 265 is rendering the current frame, rendering CPU 270 may invoke physics function requests related to the next frame. Physics GPU 210 may perform those physics functions while rendering GPU 265 is still rendering the current frame. In some embodiments, by the time rendering GPU 265 finishes rendering the current frame, the data for rendering the next frame has been received from physics computer 200, resulting in faster throughput than is possible in systems in which rendering computations and physics computations compete for GPU and other system resources.

It will be appreciated that the process shown in FIG. 3 is illustrative and that variations and modifications are possible. Steps described as sequential may be executed in parallel, order of steps may be varied, and steps may be modified or combined. For instance, the physics computations may be performed by more than one physics GPU operating in parallel on the same physics computer or on different physics computers. In another variation, applications executing on multiple rendering computers may invoke physics function requests to be processed by one or more physics computers.

Figure 4:
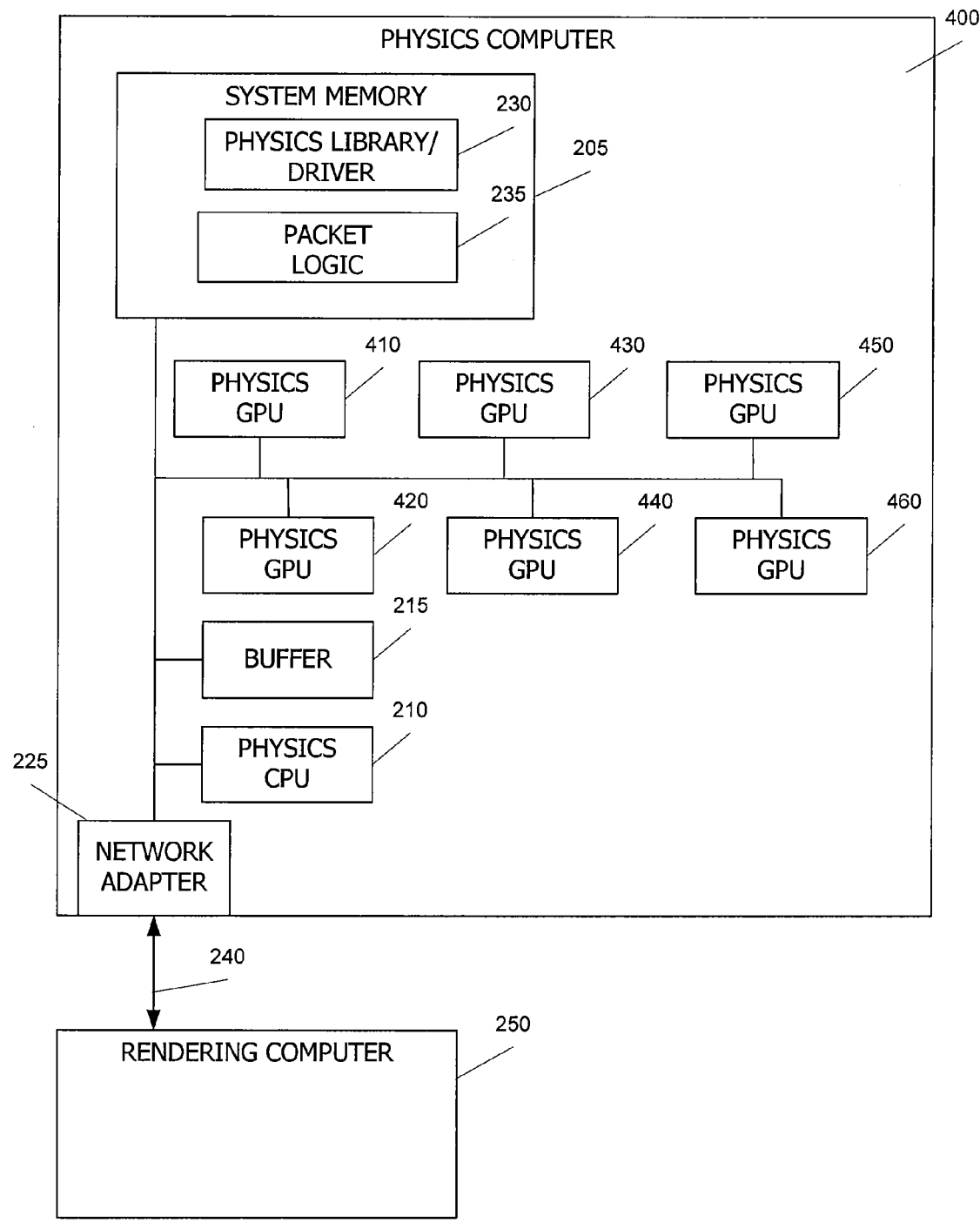
FIG. 4 is a block diagram of a system for executing an application that includes physics computations using two networked computers, according to another embodiment of the present invention.

FIG. 4 is a block diagram of a system for executing an application that includes physics computations using two networked computers, according to another embodiment of the present invention. The system includes two computers, physics computer 400 and rendering computer 250. Rendering computer 250 may include the same components and functionality as described above with reference to FIG. 2. Physics computer 400 is similar to physics computer 200 as described above with reference to FIG. 2 except that physics GPU 210 is replaced with multiple physics GPUs 410, 420, 430, 440, 450, 460.

In physics computer 400, physics function requests from rendering computer 250 invoke the corresponding physics functions in physics library/driver 230. Physics library/driver 230 forwards the appropriate commands and data to one (or more) of the physics GPUs 410-460 to perform the physics function. In one embodiment, physics library/driver 230 forwards the appropriate commands and data to an idle physics GPU. If more than one physics GPU is idle, physics library/driver 230 may forward the appropriate commands and portions of the data to more than one idle physics GPU, and multiple physics GPUs can perform computations in parallel. If no physics GPUs are idle, physics library/driver 230 forwards the appropriate commands and data to the physics GPU (or GPUs) that currently has (or have) the lowest processing load. Physics library/driver 230 may implement conventional load-balancing and/or load-monitoring algorithms to determine which physics GPU(s) should process a particular command or set of commands. The physics computation results from the one or more of the physics GPUs are returned to rendering computer 250 as described above with reference to FIG. 2.

Figure 5:
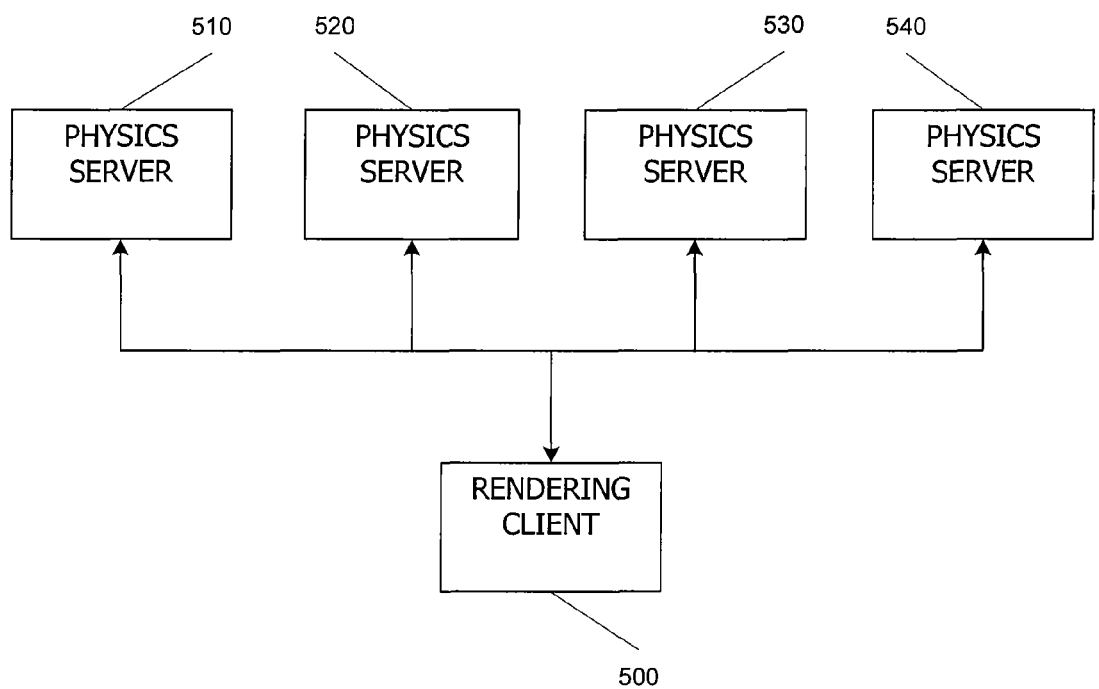
FIG. 5 is a block diagram of a system for performing physics computations using multiple physics servers for an application executing on one rendering client, according to an embodiment of the present invention.

FIG. 5 is a block diagram of a system for performing physics computations using multiple physics servers for an application executing on one rendering client, according to an embodiment of the present invention. The system includes a rendering client 500 which may have the same components and functionality as rendering computer 250 of FIG. 2. The system also includes multiple physics servers 510, 520, 530, 540, each of which may include the same components and functionality as physics computer 200 described above with reference to FIG. 2 or physics computer 400 described above with reference to FIG. 4. Rendering client 500 communicates with physics servers 510-540 over a network connection.

Physics function requests from rendering client 500 can be handled by one or more of physics servers 510-540. For example, physics servers 510-540 may be operated as a server farm or pool and may implement conventional load distribution techniques to steer incoming physics function requests to a particular server for processing; in some embodiments, a single request or stream of requests might be distributed among multiple ones of physics servers 510-540, allowing multiple physics servers to process the physics function requests in parallel. The physics computation results from the selected physics servers are returned to rendering client 500 for rendering as described above with reference to FIG. 2.

Figure 6:
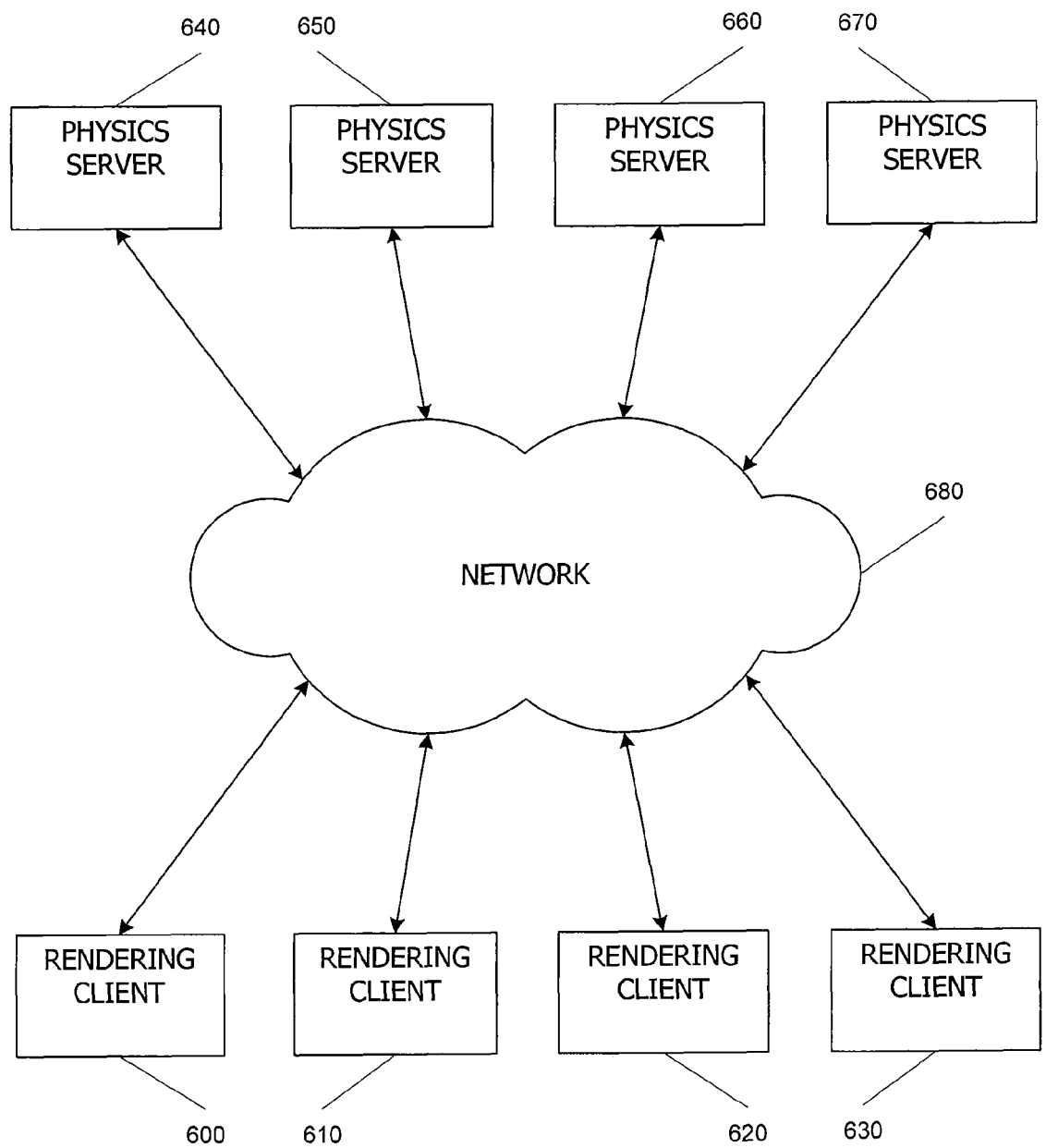
FIG. 6 is a block diagram of a system for performing physics computations on multiple physics servers for applications executing on multiple rendering clients, according to an embodiment of the present invention.

FIG. 6 is a block diagram of a system for performing physics computations on multiple physics servers for applications executing on multiple rendering clients, according to an embodiment of the present invention. The system includes rendering clients 600, 610, 620, 630, each of which may have the same components and functionality as rendering computer 250 of FIG. 2. The system also includes physics servers 640, 650, 660, 670, each of which may include the same components and functionality as physics computer 200 described above with reference to FIG. 2 or physics computer 400 described above with reference to FIG. 4. Each of the rendering clients 600-630 communicates with each of the physics servers 640-670 via a network 680. Network 680 may be a LAN, WAN, or Internet network.

Physics function requests from applications executing on any of rendering clients 600-630 are handled by at least one of physics servers 640-670. For example, applications executing on rendering clients 600 and 610 may generate physics function requests that are processed by physics server 640. Likewise, applications executing on rendering clients 620 and 630 may each generate physics requests, some of which are processed by physics server 650 and some of which are processed by physics server 660.

In one embodiment, the executing application may request that a specific physics server (or group of physics servers) processes the physics function requests. Similarly, a physics server may be configured to handle physics function requests from a specific rendering client. In another embodiment, the physics request data is forwarded form a rendering client to one or more idle physics servers (i.e., a physics server having an idle physics GPU). If no physics servers are idle, the rendering client forwards the physics request data to one or more physics servers operating at a low processing load. If more than one physics servers are selected to perform the physics computations, the physics function requests are processed in parallel by the selected servers. The physics computation results from the selected physics servers are returned to the requesting rendering client(s) for rendering as described above with reference to FIG. 2.

Performing physics computations concurrently on separate GPUs on one or more physics computers can speed up the physics computation process by reducing or eliminating the competition for system resources between physics computations and rendering computations. The distribution of the physics computations across multiple physics servers on a network reduces the bandwidth at any one server and allows for a more flexible configuration of physics servers and rendering clients. For example, physics function requests from one application may be handled on multiple physics servers, or one physics server may process physics function requests from multiple applications executing on one or more rendering clients.

While the present invention has been described with respect to particular embodiments and specific examples, it should be understood that other embodiments also fall within the spirit and scope of the invention. For instance, the physics computations may be performed by more than one physics GPU operating in parallel on the same physics computer or on different physics computers. In another variation, applications executing on multiple rendering computers may generate physics function requests to be processed by one or more physics computers.

Further, while the present invention has been described with reference to physics functions and rendering functions, it is to be understood that similar techniques could be employed for applications that use other types of auxiliary computations in addition to rendering. For instance, biological, chemical, or other types of modeling computations could be applied to object data to be rendered. As long as the modeling computations are invoked by an application via API function calls and as long as a driver that supports execution of the API function calls by a GPU exists, a modeling daemon can be used to forward the API function calls to another computer system for handling by a remote GPU.

Although embodiments described herein may make reference to a CPU and a GPU as discrete components of a computer system, those skilled in the art will recognize that a CPU and a GPU can be integrated into a single device, and the CPU and GPU may share various resources such as instruction logic, buffers, functional units and so on; or separate resources may be provided for graphics and general-purpose operations. Accordingly, any or all of the circuits and/or functionality described herein as being associated with the GPU could also be implemented in and performed by a suitably equipped CPU.

Further, while embodiments described herein may make reference to a GPU, it is to be understood that the circuits and/or functionality described herein could also be implemented in other types of processors, such as general-purpose or other special-purpose co-processors, or within a CPU.

The scope of the invention should, therefore, be determined with reference to the appended claims along with their full scope of equivalents.

What is claimed is:

1. A method for performing physics computations, the method comprising:
   receiving a physics function request and data associated with the physics function request from a rendering computer via a network;
   identifying a physics function associated with the physics function request;
   operating a local graphics processing unit (GPU) to perform the identified physics function, thereby generating physics result data for a first frame, wherein, concurrently with generating physics result data for the first frame, the rendering computer renders a second frame; and
   transmitting the physics result data to the rendering computer via the network.

2. The method of claim 1 further comprising selecting one of a plurality of local GPUs to be operated during the act of operating.

3. The method of claim 2 wherein the selecting comprises selecting the one of the local GPUs with a lowest processing load.

4. The method of claim 1 further comprising selecting two or more of a plurality of local GPUs to be operated in parallel during the act of operating.

5. The method of claim 1 wherein operating the local GPU comprises invoking a command to the GPU, the command being associated with the identified physics function in a physics library.

6. A method for rendering an image, comprising:
   executing an application that invokes a first physics function request, the first physics function request specifying a first physics function to be performed on first input data;
   in response to the first physics function request, formatting the first physics function request and the first input data for transmission over a network;
   transmitting the first physics function request and the first input data via the network to a physics computer adapted to perform the first physics function on the first input data and generate first physics result data for a first frame, wherein, concurrently with generating physics result data for the first frame, a rendering computer renders a second frame; and receiving from the physics computer via the network the first physics result data generated by the physics computer.

7. The method of claim 6, further comprising providing the first physics result data to a local GPU adapted to render an image using the first physics result data.

8. The method of claim 7 further comprising, while rendering the image:
invoking the second physics function request while executing the application, the second physics function request specifying a second physics function to be performed on second input data;
in response to the second physics function, formatting the second physics function request and the second input data for transmission over the network;
transmitting the second physics function request and the second input data via the network to the physics compute, wherein the physics computer performs the second physics function on the second input data and generates second physics result data; and
receiving from the physics computer via the network the second physics result data generated by the physics computer.

9. The method of claim 6 wherein the formatting comprises assembling the first physics function request and the first input data into data packets for transmission via the network.

10. A system for executing an application that includes physics computations, comprising:
a physics computer communicably coupled to a network, the physics computer comprising:
a physics GPU adapted to perform physics computations; and
a central processing unit (CPU) adapted to receive physics function requests and associated input data via the network, to direct the physics GPU to perform one or more physics computations on the associated input data in response to each physics function request, and to return physics result data from the one or more physics computations via the network;
a rendering computer communicably coupled to the network, the rendering computer comprising:
a rendering GPU adapted to perform rendering computations; and
a CPU adapted to generate physics function requests, to transmit the physics function requests and associated input data via the network to the physics computer, to receive the physics result data from the physics computer via the network, and to direct the rendering GPU to perform one or more rendering computations on the received physics result data; and
wherein the rendering GPU is configured to perform the one or more rendering computations concurrently with the physics GPU performing the one or more physics computations.

11. The system of claim 10 wherein the CPU of the rendering computer is further adapted to generate the physics function requests while executing an application program.

12. The system of claim 10 wherein the physics computer further comprises a plurality of physics GPUs operable in parallel, and wherein the CPU of the physics computer is further adapted to select one or more of the physics GPUs to perform physics computations in parallel on different portions of the input data.

13. The system of claim 12 wherein the CPU of the physics computer is further adapted such that the selection is based on respective processing loads of the physics GPUs.

14. The system of claim 10 further comprising a second rendering computer, the second rendering computer including:
a rendering GPU adapted to perform rendering computations; and
a CPU adapted to generate physics function requests, to transmit the physics function requests and associated input data via the network to the physics computer, to receive physics result data from the physics computer via the network, and to direct the rendering GPU to perform one or more rendering computations on the received physics result data.

15. The system of claim 10 wherein the physics computer is one of a plurality of physics computers, and wherein the plurality of physics computers is configured such that one or more of the physics computers is selected to receive each physics function request generated by the CPU of the rendering computer.

16. The system of claim 15 wherein the plurality of physics computers is configured such that the selection is based on respective processing loads of the physics computers.

17. The system of claim 15 further comprising a second rendering computer, the second rendering computer including:
a rendering GPU adapted to perform rendering computations; and
a CPU adapted to generate physics function requests, to transmit the physics function requests and associated input data via the network to the plurality of physics computers, to receive physics result data from the plurality of physics computers via the network, and to direct the rendering GPU to perform one or more rendering computations on the received physics result data.

18. The system of claim 10 wherein the rendering CPU is further configured to format the first physics function request and the first input data into data packets for transmission via the network.

19. The system of claim 10 wherein the CPU of the physics computer is further adapted to access a physics library that associates physics functions with GPU commands and to direct the physics GPU to perform the one or more physics computations by invoking a GPU command associated in the physics library with the received physics function request.

20. The system of claim 10 wherein the rendering GPU is further adapted to render an image using the results of the one or more rendering computations.

* * * * *